United States Patent
Jun et al.

(10) Patent No.: US 10,297,363 B2
(45) Date of Patent: *May 21, 2019

(54) COMPOSITION FOR FORMING CONDUCTIVE PATTERN AND RESIN STRUCTURE HAVING CONDUCTIVE PATTERN

(71) Applicant: LG CHEM, LTD., Seoul (KR)

(72) Inventors: Shin Hee Jun, Daejeon (KR); Dae Ki Lee, Daejeon (KR); Se Hui Sohn, Daejeon (KR); Han Nah Jeong, Daejeon (KR); Cheol-Hee Park, Daejeon (KR); Chee-Sung Park, Daejeon (KR); Jae Hyun Kim, Daejeon (KR); Ha Na Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 146 days.

This patent is subject to a terminal disclaimer.

(21) Appl. No.: 15/504,268

(22) PCT Filed: Sep. 17, 2015

(86) PCT No.: PCT/KR2015/009785
§ 371 (c)(1),
(2) Date: Feb. 15, 2017

(87) PCT Pub. No.: WO2016/043541
PCT Pub. Date: Mar. 24, 2016

(65) Prior Publication Data
US 2017/0236614 A1 Aug. 17, 2017

(30) Foreign Application Priority Data

Sep. 17, 2014 (KR) .................. 10-2014-0123650
Sep. 16, 2015 (KR) .................. 10-2015-0130983

(51) Int. Cl.
*H01B 5/14* (2006.01)
*H01B 1/02* (2006.01)
(Continued)

(52) U.S. Cl.
CPC ............... *H01B 5/14* (2013.01); *C08J 7/123* (2013.01); *C08K 3/32* (2013.01); *C08L 69/00* (2013.01);
(Continued)

(58) Field of Classification Search
CPC ..... C23C 18/204; C23C 18/1641; H01B 1/22; H01B 5/14; H05K 1/0373
See application file for complete search history.

(56) References Cited

U.S. PATENT DOCUMENTS 4,977,007 A * 12/1990 Kondo .................. G02F 1/1525
264/104
6,451,487 B1 * 9/2002 Besner .................... H01M 4/02
429/304
(Continued)

FOREIGN PATENT DOCUMENTS

CN 101278607 A 10/2008
CN 102066122 A 5/2011
(Continued)

OTHER PUBLICATIONS

Martinez-Juarez et al., "Effect of the Phase Transition of LiSn2(PO4)3 on the Li+ Ion Conduction in LiSn2(PO4)3-Teflon Composites", J Phys: Condens Matter, 1997, vol. 9, p. 4119-4128. (Year: 1997).*
(Continued)

*Primary Examiner* — Gerard Higgins
(74) *Attorney, Agent, or Firm* — Dentons US LLP

(57) ABSTRACT

The present invention relates to a composition for forming a conductive pattern and a resin structure having a conductive pattern, wherein the composition makes it possible to
(Continued)

form a fine conducive pattern on various polymer resin products or resin layers through a simple process, and can more effectively meet needs of the art, such as displaying various colors.

10 Claims, 3 Drawing Sheets

(51) Int. Cl.
| | |
|---|---|
| H05K 1/03 | (2006.01) |
| H05K 3/10 | (2006.01) |
| H05K 3/18 | (2006.01) |
| C08J 7/12 | (2006.01) |
| C08K 3/32 | (2006.01) |
| C08L 69/00 | (2006.01) |
| C23C 18/16 | (2006.01) |
| C23C 18/20 | (2006.01) |
| C23C 18/40 | (2006.01) |
| H01B 1/22 | (2006.01) |

(52) U.S. Cl.
CPC ........ *C23C 18/1641* (2013.01); *C23C 18/204* (2013.01); *C23C 18/405* (2013.01); *H01B 1/026* (2013.01); *H01B 1/22* (2013.01); *H05K 1/0313* (2013.01); *H05K 1/0373* (2013.01); *H05K 3/105* (2013.01); *H05K 3/182* (2013.01); *C08J 2369/00* (2013.01); *C08J 2483/04* (2013.01); *C08K 2003/328* (2013.01); *C08L 2203/20* (2013.01); *C08L 2205/06* (2013.01); *H05K 2201/012* (2013.01); *H05K 2201/0129* (2013.01); *H05K 2201/0209* (2013.01); *H05K 2201/0236* (2013.01); *H05K 2203/072* (2013.01); *H05K 2203/107* (2013.01); *Y10T 428/24802* (2015.01); *Y10T 428/24917* (2015.01)

(56) References Cited

U.S. PATENT DOCUMENTS

| | | |
|---|---|---|
| 2004/0241422 A1 | 12/2004 | Naundorf et al. |
| 2005/0069688 A1 | 3/2005 | Kliesch et al. |
| 2005/0163987 A1 | 7/2005 | Kliesch et al. |
| 2009/0277672 A1 | 11/2009 | Matsumoto |
| 2009/0292048 A1 | 11/2009 | Li et al. |
| 2010/0282505 A1 | 11/2010 | Ichiki et al. |
| 2011/0281135 A1 | 11/2011 | Gong et al. |
| 2012/0279764 A1 | 11/2012 | Jiang et al. |
| 2013/0043062 A1 | 2/2013 | Wismann |
| 2013/0089486 A1 | 4/2013 | Cedar et al. |
| 2013/0106659 A1 | 5/2013 | Yung et al. |
| 2013/0136869 A1 | 5/2013 | Hamilton et al. |
| 2013/0289178 A1 | 10/2013 | Li et al. |
| 2016/0203886 A1* | 7/2016 | Jeong ................ H01B 1/22 174/258 |
| 2016/0333481 A1 | 11/2016 | Gong et al. |
| 2017/0140849 A1 | 5/2017 | Jeong et al. |

FOREIGN PATENT DOCUMENTS

| | | |
|---|---|---|
| CN | 103053227 A | 4/2013 |
| CN | 103741125 A | 4/2014 |
| DE | 3316909 A1 | 1/1985 |
| EP | 1364984 A1 | 11/2003 |
| JP | 2007287994 A | 11/2007 |
| JP | 2010212062 A | 9/2010 |
| JP | 2013520383 A | 6/2013 |
| JP | 2016529738 A | 9/2016 |
| JP | 2017526769 A | 9/2017 |
| KR | 1020040021614 A | 3/2004 |
| KR | 1020050030161 A | 3/2005 |
| KR | 1020050077281 A | 8/2005 |
| KR | 100716486 B1 | 5/2007 |
| KR | 1020110076496 A | 7/2011 |
| KR | 1020110112860 A | 10/2011 |
| KR | 101377273 B1 | 3/2014 |
| KR | 101434423 B1 | 8/2014 |
| KR | 1020150079416 A | 7/2015 |
| WO | WO-2015102270 A1 * | 7/2015 ............... H01B 1/22 |

OTHER PUBLICATIONS

Morgan, et al.: "Experimental and computational study of the structure and electrochemical properties of monoclinic LixM2(PO4)3 compounds", XP004430268, Journal of Power Sources, Elsevier, vol. 119-121, Jun. 12, 2003, pp. 755-759.

Serghini, et al.: "The monovalent copper tin phosphate CuISn2(P04)3", Materials Letters, vol. 22, Feb. 28, 1995, pp. 149-153.

Losilla, et al.: "Reversible Triclinic-Rhombohedral Phase Transition in LiHf2(PO4)3: Crystal Structures from Neutron Powder Diffraction", XP055434966, Chemistry of Materials, vol. 9, No. 7, Jul. 1, 1997, pp. 1678-1685.

N.A. Mustaffa et al., "Low-temperature sintering effects on Nasicon-structured LiSn2P3O12 solid electrolytes prepared via citric acid-assisted sol-gel method," Ionics (2015)21:955-965.

* cited by examiner

COMPOSITION FOR FORMING CONDUCTIVE PATTERN AND RESIN STRUCTURE HAVING CONDUCTIVE PATTERN

CROSS-REFERENCE TO RELATED APPLICATION

This application is a National Stage Application of International Application No. PCT/KR2015/009785, filed Sep. 17, 2015, and claims the benefit of Korean Patent Application No. 10-2015-0130983, filed Sep. 16, 2015, and Korean Patent Application No. 10-2014-0123650, filed Sep. 17, 2014, the contents of which are incorporated herein by reference in their entirety for all purposes as if fully set forth below.

TECHNICAL FIELD

The present invention relates to a composition for forming a conductive pattern, which enables formation of a fine conductive pattern onto a variety of polymer resin products or resin layers by a very simplified process and is able to more effectively satisfy requirements in the art such as realization of a variety of colors, etc., and a resin structure having the conductive pattern.

BACKGROUND ART

With the recent development of microelectronic technology, a need for structures having a fine conductive pattern which is formed on the surface of a polymer resin substrate (or product) such as a variety of resin products or resin layers has grown. The conductive pattern on the surface of the polymer resin substrate may be applied to form various objects such as antennas integrated into an electronic device case, a variety of sensors, MEMS structures, RFID tags, etc.

As described above, with increasing interest in the technology of forming the conductive pattern on the surface of the polymer resin substrate, several technologies regarding this were suggested. However, a method capable of more effectively using these technologies has not been suggested yet.

For example, according to the previously known technology, a method of forming the conductive pattern by forming a metal layer on the surface of the polymer resin substrate and then applying photolithography, or a method of forming the conductive pattern by printing a conductive paste may be considered. However, when the conductive pattern is formed according to this technology, there are disadvantages that a process or equipment to be needed becomes too complicated, or it is difficult to form an excellent fine conductive pattern.

Accordingly, there is a continuous need to develop a technology capable of more effectively forming the fine conductive pattern on the surface of the polymer resin substrate by a simplified process.

As one of technologies capable of satisfying the demand in the art, a method of simply forming the conductive pattern on the surface of a polymeric resin substrate by including a specific inorganic additives in the resin, irradiating an electromagnetic wave to a region on which a conductive pattern is to be formed, and then, progressing plating on the region to which the electromagnetic wave is irradiated has been suggested.

However, in this method of forming the conductive pattern, since the kinds of inorganic additives previously suggested are extremely limitative, it is difficult to satisfy a variety of requirements of the art, for example, realization of a variety of colors, etc. Thus, there is a demand for development of various kinds of inorganic additives capable of satisfying a variety of requirements of the art.

DISCLOSURE

Technical Problem

The present invention provides a composition for forming a conductive pattern, which enables formation of a fine conductive pattern onto a variety of polymer resin products or resin layers by a very simplified process and is able to more effectively satisfy requirements in the art such as realization of a variety of colors, etc.

Further, the present invention provides a resin structure having a conductive pattern, which is formed from the composition for forming the conductive pattern, etc. by a method of forming the conductive pattern.

Technical Solution

The present invention provides a composition for forming a conductive pattern by electromagnetic irradiation, including: a polymer resin; and a non-conductive metal compound which has $P\bar{1}$ space group of a triclinic structure or Cc or C2/c space group of a monoclinic structure and is represented by Chemical Formula 1, in which a metal core is formed from the non-conductive metal compound by electromagnetic irradiation:

$$A_xB_2P_3O_{12} \qquad \text{[Chemical Formula 1]}$$

wherein A and B are each independently metals different from each other, and x is a rational number of 0.5 to 1.

In the composition for forming the conductive pattern, A of Chemical Formula 1 is one or more metals selected from the group consisting of Li, Na, Cu, Ag and Au, and B of Chemical Formula 1 is one or more metals selected from the group consisting of Sn, Ti, Zr and Hf.

The composition for forming the conductive pattern may further include a non-conductive metal compound which has $R\bar{3}c$ space group of a trigonal structure and is represented by Chemical Formula 1.

Meanwhile, with regard to the composition for forming the conductive pattern, the polymer resin may include a thermosetting resin or a thermoplastic resin, and more specific examples thereof may include one or more selected from the group consisting of an acrylonitrile poly-butadiene styrene (ABS) resin, a polyalkyleneterephthalate resin, a polycarbonate resin, a polypropylene resin, and a polyphthalamide resin.

Further, with regard to the composition for forming the conductive pattern, the non-conductive metal compound may be included in an amount of approximately 0.1% by weight to approximately 15% by weight, based on the total composition.

Further, the composition for forming the conductive pattern may further include one or more additives selected from the group consisting of a flame retardant, a heat stabilizer, a UV stabilizer, a lubricant, an antioxidant, an inorganic filler, a color additive, an impact modifier, and a functional modifier.

Meanwhile, the present invention also provides a resin structure having a conductive metal layer (conductive pattern) formed on the surface of a polymer resin, the conductive metal layer being obtained by using the above-described composition for forming the conductive pattern. The resin structure having the conductive pattern may include a polymer resin substrate; a non-conductive metal compound which is dispersed in the polymer resin substrate, has $P\bar{1}$ space group of a triclinic structure or Cc or C2/c space group of a monoclinic structure, and is represented by Chemical Formula 1; an adhesion-activated surface having a metal core which is exposed on the surface of a predetermined region of the polymer resin substrate; and a conductive metal layer formed on the adhesion-activated surface:

$A_xB_2P_3O_{12}$   [Chemical Formula 1]

wherein A and B are each independently metals different from each other, and x is a rational number of 0.5 to 1.

In the resin structure having the conductive pattern, the predetermined region where the adhesion-activated surface and the conductive metal layer are formed may correspond to the region of the polymer resin substrate to which an electromagnetic wave is irradiated.

Further, the resin structure may have impact strength of approximately 4.0 J/cm or more, as measured by Izod notched type according to ASTM D256.

Effect of the Invention

According to the present invention, provided is a composition for forming a conductive pattern, which enables formation of a fine conductive pattern onto a variety of polymer resin substrates such as polymer resin products or resin layers by a very simplified process of laser electromagnetic irradiation, and a resin structure having the conductive pattern which is formed from the composition.

Particularly, if the composition for forming the conductive pattern is used, requirement of the art such as realization of a variety of colors of a resin structure (a variety of polymer resin products, resin layers, etc.) may be more effectively satisfied, and satisfactory conductive patterns may be easily formed on the resin structure.

Therefore, the composition for forming the conductive pattern may be used to very effectively form conductive patterns on a variety of resin products, such as a mobile phone or tablet PC case, RFID tags, various sensors, MEMS structures or the like.

DETAILED DESCRIPTION OF THE EMBODIMENTS

Hereinafter, a composition for forming a conductive pattern, and a resin structure having a conductive pattern formed from the composition according to specific embodiments of the present invention will be described.

According to one embodiment of the present invention, provided is a composition for forming a conductive pattern by electromagnetic irradiation, including: a polymer resin; and a non-conductive metal compound which has $P\bar{1}$ space group of a triclinic structure or Cc or C2/c space group of a monoclinic structure and is represented by Chemical Formula 1, in which a metal core is formed from the non-conductive metal compound by electromagnetic irradiation:

$A_xB_2P_3O_{12}$   [Chemical Formula 11]

wherein A and B are each independently metals different from each other, and x is a rational number of 0.5 to 1. Chemical Formula 1 may be also represented by $A_xB_2(PO_4)_3$. Specifically, in Chemical Formula 1, A is one or more metals selected from the group consisting of Li, Na, Cu, Ag and Au, and B is one or more metals selected from the group consisting of Sn, Ti, Zr and Hf.

The non-conductive metal compound represented by Chemical Formula 1 may have space groups of many different crystal structures according to the position of A metal in a basic structure, in which $PO_4$ tetrahedrons and $BO_6$ octahedrons are three-dimensionally connected to each other via shared oxygen atoms at the edges.

Figure 1:
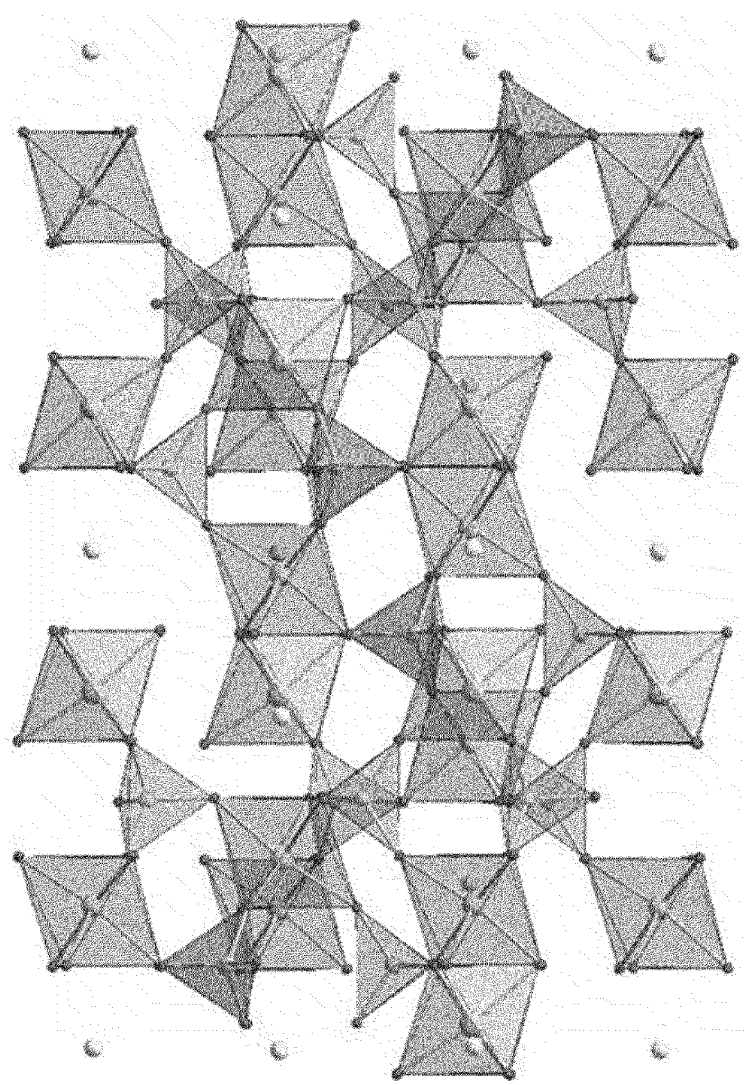
FIG. 1 is a schematic illustration showing a structure of a non-conductive metal compound having $R\bar{3}c$ space group of a trigonal structure, which is included in a composition for forming a conductive pattern according to an embodiment of the present invention.

In general, when the non-conductive metal compound represented by Chemical Formula 1 is synthesized, it is obtained as a crystal structure belonging to $R\bar{3}c$ space group of a trigonal structure which is the most stable form, as illustrated in FIG. 1.

This structure is a structure, in which A element is situated in a channel surrounded by six oxygen atoms in a crystal lattice formed by four $PO_4$ tetrahedrons and two $BO_6$ octahedrons.

Figure 2:
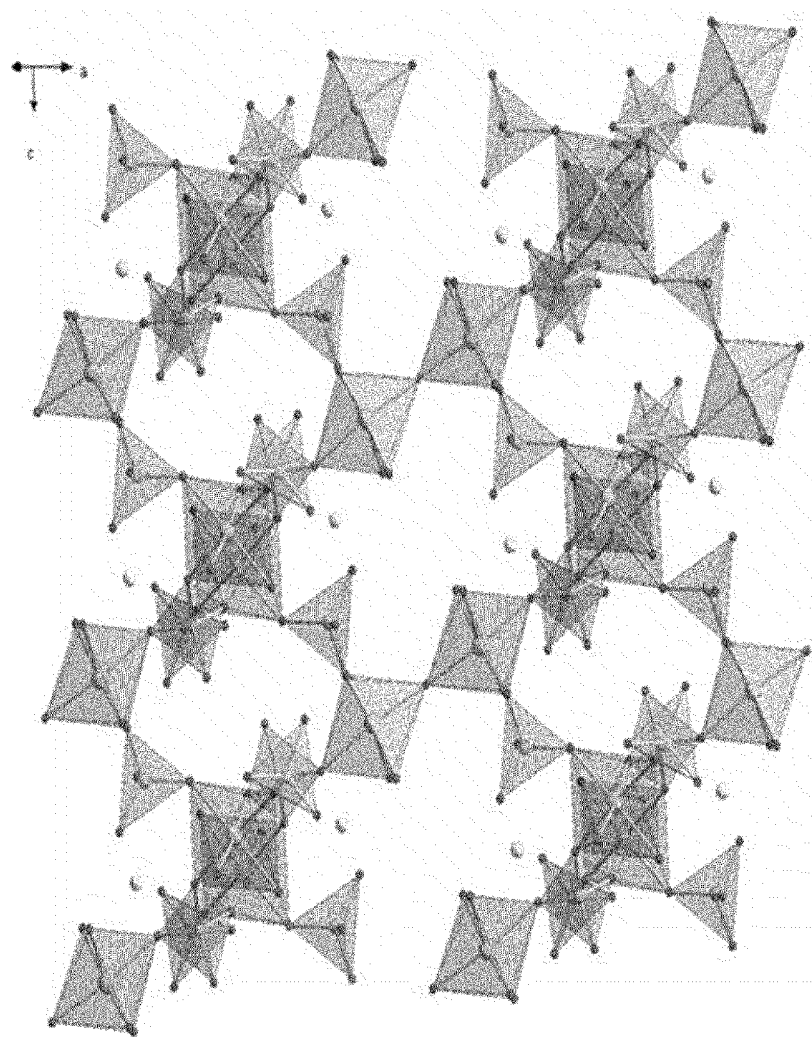
FIG. 2 is a schematic illustration showing a structure of a non-conductive metal compound having $P\bar{1}$ space group of a triclinic structure, which is included in a composition for forming a conductive pattern according to another embodiment of the present invention.

Meanwhile, the non-conductive metal compound having the trigonal structure may have a triclinic or monoclinic structure by phase transition, as illustrated in FIG. 2.

In the $R\bar{3}c$ structure, when the center of the channel formed by two $PO_4$ tetrahedrons and four $BO_6$ octahedrons is 0 0 0, this position changes to $$\frac{1}{4}\frac{1}{4}0, \frac{3}{4}\frac{1}{4}\frac{1}{2}, \frac{3}{4}\frac{3}{4}0, \frac{1}{4}\frac{3}{4}\frac{1}{2}$$

by reducing the symmetry of the crystal structure to C2/c, and A element may be situated while sharing four oxygen atoms. However, A elements are situated in not all these positions, and A elements may exist in some of the positions.

Further, when the crystal structure is Cc, the $$\frac{1}{4}\frac{1}{4}0, \frac{3}{4}\frac{1}{4}\frac{1}{2}$$

position, in which 2-fold symmetry disappears, may become M1 site sharing two oxygen atoms, and the $$\frac{3}{4}\frac{3}{4}0, \frac{1}{4}\frac{3}{4}\frac{1}{2}, \frac{3}{4}\frac{3}{4}0, \frac{1}{4}\frac{3}{4}\frac{1}{2}$$

position may become M2 site sharing four oxygen atoms, as in C2/c. A element is situated in only part of the M2 site in most $P\bar{1}$ structures. Further, when A element is a transition metal element such as Cu, the oxidation number may change from 1 to 2. Therefore, in Chemical Formula 1, x has a value of 0.5 to 1.

The crystal structure of the non-conductive metal compound represented by Chemical Formula 1 may be determined, depending on phase transition which occurs according to a calcination temperature upon synthesis of the compound and a kind of the metal included in the compound.

In general, when calcination is carried out at a high temperature of approximately 1000° C. or higher in order to synthesize the non-conductive metal compound of Chemical Formula 1, it is possible to obtain the non-conductive metal compound having $R\bar{3}c$ space group of a trigonal structure which is a stable phase.

In contrast, when calcination is carried out at a low temperature of approximately 1000° C. or lower in order to synthesize the non-conductive metal compound of Chemical Formula 1, it is possible to obtain the non-conductive metal compound of Chemical Formula 1 belonging to $P\bar{1}$ space group of the triclinic structure which has a lower symmetry than the trigonal structure, or the non-conductive metal compound of Chemical Formula 1 belonging to Cc or C2/c space group of the monoclinic structure.

However, in the case of the low-temperature calcination, the non-conductive metal compound having $R\bar{3}c$ space group of the trigonal structure may be partly synthesized, and in the case of the high-temperature calcination, the non-conductive metal compound having $P\bar{1}$ space group of the triclinic structure or Cc or C2/c space group of the monoclinic structure may be partly synthesized. Therefore, the composition for forming the conductive pattern may further include the non-conductive metal compound of Chemical Formula 1 having $R\bar{3}c$ space group of the trigonal structure, in addition to the non-conductive metal compound of Chemical Formula 1 having $P\bar{1}$, Cc or C2/c space group.

As described in more detail below, when the composition for forming the conductive pattern including the non-conductive metal compound of Chemical Formula 1 having $P\bar{1}$, Cc or C2/c space group is used to mold a polymer resin product or a resin layer, and then a predetermined region thereof is irradiated with an electromagnetic wave such as laser, a metal core may be formed from the non-conductive metal compound. Although the non-conductive metal compound of Chemical Formula 1 having $P\bar{1}$, Cc or C2/c space group is chemically stable under general environment, the metal present in the A site or ions thereof may be easily separated from the above material in a region which is exposed to an electromagnetic wave having a particular wavelength. Thus, the metal core may be more easily formed by electromagnetic radiation.

The metal core thus formed may be selectively exposed on a predetermined region to which electromagnetic wave is irradiated, to form an adhesion-activated surface on the surface of a polymeric resin substrate. Subsequently, by chemical reduction of the metal core including the metal or the ion thereof separated from the non-conductive metal compound or by electroless plating using the metal cores as a seed and a plating solution containing the conductive metal ions, a conductive metal layer may be formed on the adhesion-activated surface including the metal cores.

Meanwhile, with regard to the composition of an embodiment, before irradiation of electromagnetic wave, the non-conductive metal compound of Chemical Formula 1 having the $P\bar{1}$, Cc or C2/c space group exhibits non-conductivity and has excellent compatibility with the polymer resin, and also is chemically stable in the solution used in reduction or plating treatment to maintain non-conductivity.

Therefore, the non-conductive metal compound of Chemical Formula 1 having the $P\bar{1}$, Cc or C2/c space group is uniformly dispersed in the polymer resin substrate and maintains chemically stable state to exhibit non-conductivity in the region to which electromagnetic wave is not irradiated. In contrast, the metal or the ion thereof may be readily generated from the non-conductive metal compound in the predetermined region to which an electromagnetic wave such as laser is irradiated. Thus, as described above, the metal core and the fine conductive pattern may be formed.

Therefore, when the above-described composition according to one embodiment is used, the fine conductive pattern may be easily formed on the polymer resin substrate such as polymer resin products or resin layers by a very simple process of laser electromagnetic irradiation. Particularly, metal cores promoting formation of the conductive pattern may be very easily formed, and therefore, the composition may be used to very easily form a superior conductive pattern, compared to previously known compositions of the same kind.

Additionally, the non-conductive metal compound of Chemical Formula 1 having the $P\bar{1}$, Cc or C2/c space group, represented by a compound such as $Cu_xSn_2(PO_4)_3$ ($0.5 \leq x \leq 1$), may exhibit almost a white color or a light color close to a light blue color, and hardly colors a variety of polymer resin products or resin layers. Therefore, when the composition including the same of an embodiment is used, consumers' demand for a variety of colors of the polymer resin products may be effectively satisfied even by using a relatively small amount of color additive.

Meanwhile, in the above-described composition for forming the conductive pattern of one embodiment, any thermosetting resin or thermoplastic resin capable of forming various polymer resin products or resin layers may be used as the polymer resin without limitation. In particular, the above-described particular non-conductive metal compound may exhibit excellent compatibility and uniform dispersibility with respect to various polymer resins, and the composition of one embodiment may include various polymer resins and may be molded to various resin products or resin layers. Specific examples of the polymer resin may include an ABS resin, a polyalkyleneterephthalate resin such as a polybutyleneterephthalate resin or a polyethyleneterephthalate resin, a polycarbonate resin, a polypropylene resin, a polyphthalamide resin, etc., and it may also include various other polymer resins.

Further, in the composition for forming the conductive pattern, the non-conductive metal compound of Chemical Formula 1 having $P\bar{1}$, Cc or C2/c space group may be included in an amount of approximately 0.1% by weight to approximately 15% by weight, or approximately 3% by weight to approximately 13% by weight, based on the total composition, and the polymer resin may be included in the remaining amount. When the content is within the above range, the polymer resin product or the resin layer formed from the composition properly maintains the basic physical properties such as mechanical properties, and the conductive pattern is also preferably formed on a predetermined region by electromagnetic irradiation.

The composition for forming the conductive pattern may further include one or more additives selected from the group consisting of a flame retardant, a heat stabilizer, a UV stabilizer, a lubricant, an antioxidant, an inorganic filler, a color additive, an impact modifier, and a functional modifier, in addition to the above-described polymer resin and the predetermined non-conductive metal compound. By addition of the additives, the physical properties of the resin structure obtained from the composition of one embodiment may be appropriately modified. Among the additives, the color additive, for example, a pigment may be included in an amount of approximately 0.1% by weight to approximately 10% by weight to afford a desired color to the resin structure.

Representative examples of the color additive such as the pigment may include a white pigment such as ZnO, ZnS, Talc, $TiO_2$, $SnO_2$, $CaCO_3$, $Sb_2O_3$, $BaSO_4$, clay, etc., and other color additives such as pigments of various kinds and colors which are known to be usable in a polymer resin composition may be also used.

The flame retardant may include a phosphorous-based flame retardant and an inorganic flame retardant. More specifically, the phosphorous-based flame retardant may include phosphate ester-based flame retardants such as triphenyl phosphate (TPP), trixylenyl phosphate (TXP), tricresyl phosphate (TCP), triisophenyl phosphate (REOFOS), etc.; aromatic polyphosphate-based flame retardants; polyphosphate-based flame retardants; or red phosphorous-based flame retardant, etc., and various other phosphorous-based flame retardants known to be usable in a resin composition may be used without particular limitations. In addition, the inorganic flame retardant may include aluminum hydroxide, magnesium hydroxide, zinc borate, molybdenum oxide ($MoO_3$), molybdenum peroxide salt ($Mo_2O_7^{2-}$), calcium-zinc-molybdate, antimony trioxide ($Sb_2O_3$), antimony pentoxide ($Sb_2O_5$), etc. However, the examples of the inorganic flame retardant are not limited thereto, and various other inorganic flame retardants known to be usable in a resin composition may be used without particular limitations.

Further, the impact modifier, heat stabilizer, UV stabilizer, lubricant or antioxidant may be included in an amount of approximately 0.01% by weight to approximately 5% by weight or approximately 0.05% by weight to approximately 3% by weight to appropriately afford desired properties to the resin structure.

Hereinafter, a method of forming the conductive pattern on the polymer resin substrate such as the resin product or the resin layer by direct electromagnetic irradiation using the above-described composition for forming the conductive pattern of an embodiment will be explained in detail. The method of forming the conductive pattern may include molding the above-described composition for forming the conductive pattern to a resin product or applying it to another product to form a resin layer; irradiating an electromagnetic wave to a predetermined region of the resin product or the resin layer to generate a metal core including the metal or ions thereof from the non-conductive metal compound particles of Chemical Formula 1 having $P\bar{1}$, Cc or C2/c space group; and chemically reducing or plating the region generating the metal core to form the conductive metal layer.

Hereinafter, each step of the method of forming the conductive pattern will be described with reference to the accompanying drawings. For reference, FIG. 3 illustrates a schematic diagram showing each step of an exemplary method of forming the conductive pattern.

In the method of forming the conductive pattern, first, the above-described composition for forming the conductive pattern is molded to the resin product or is applied to another product to form the resin layer. In the molding of the resin product or in the forming of the resin layer, a method of molding a product or a method of forming a resin layer using a general polymer resin composition may be applied without limitation. For example, when the resin product is molded using the composition, the composition for forming the conductive pattern is extruded and cooled to form pellets or particles, which are subjected to injection-molding in a desired shape, thereby manufacturing a variety of polymer resin products.

The polymer resin product or the resin layer thus formed may have the above described particular non-conductive metal compound which is uniformly dispersed on the resin substrate formed from the polymer resin. In particular, since the non-conductive metal compound of Chemical Formula 1 having $P\bar{1}$, Cc or C2/c space group has excellent compatibility and chemical stability for various polymer resins, the non-conductive metal compound is uniformly dispersed throughout the resin substrate while maintaining non-conductivity.

Figure 3:
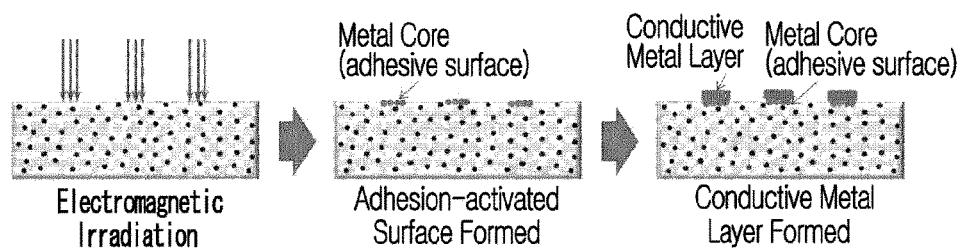
FIG. 3 is a schematic illustration showing each step of an exemplary method of forming a conductive pattern by using the composition according to an embodiment.

After forming the polymer resin product or the resin layer, as illustrated in the first figure of FIG. 3, an electromagnetic wave such as laser, etc. may be irradiated to a predetermined region of the resin product or the resin layer, on which the conductive pattern is intended to be formed. When the electromagnetic wave is irradiated, the metal or ions thereof may be generated from the non-conductive metal compound of Chemical Formula 1 having $P\bar{1}$, Cc or C2/c space group, and metal cores including the same may be generated (see the second figure of FIG. 3).

More specifically, when the generating of the metal cores by electromagnetic irradiation is carried out, part of the non-conductive metal compound of Chemical Formula 1 having $P\bar{1}$, Cc or C2/c space group is exposed on the surface of the predetermined region of the resin product or the resin layer, and metal cores are generated therefrom, and thus the adhesion-activated surface which is activated to have higher adhesion may be formed. Since the adhesion-activated surface is selectively formed on the specific region to which the electromagnetic wave is irradiated, the conductive metal layer may be selectively formed on the predetermined region of the polymer resin substrate, when conductive metal ions are chemically reduced by chemical reduction of the conductive metal ions included in the metal core and the adhesion-activated surface, and/or electroless plating thereof in the plating step described below. More specifically, upon electroless plating, the metal cores function as a kind of seed to form a strong bond with the conductive metal ions included in the plating solution, when the conductive metal ions are chemically reduced. As a result, the conductive metal layer may be selectively formed in an easier manner Meanwhile, in the generating of the metal cores, a laser electromagnetic wave among electromagnetic waves may be irradiated, for example, a laser electromagnetic wave having a wave length of approximately 248 nm, approximately 308 nm, approximately 355 nm, approximately 532 nm, approximately 585 nm, approximately 755, approximately 1064 nm, approximately 1550 nm, or approximately 2940 nm may be irradiated. For another example, a laser electromagnetic wave in the infrared (IR) region may be irradiated. Further, the laser electromagnetic wave may be irradiated under common conditions or power.

By the laser electromagnetic irradiation, the metal cores may be more effectively formed from the non-conductive metal compound of Chemical Formula 1 having $P\bar{1}$, Cc or C2/c space group, and the adhesion-activated surface including the same may be selectively formed on the predetermined region and exposed.

Meanwhile, after the generating of the metal cores, as illustrated in the third figure of FIG. 3, the forming of the conductive metal layer by chemically reducing or plating the region generating metal cores may be carried out. As a result of the reducing or plating, the conductive metal layer may be selectively formed on the predetermined region exposing the metal core and the adhesion-activated surface, and the chemically stable non-conductive metal compound maintains its non-conductivity on the other region. Therefore, the fine conductive pattern may be selectively formed only on the predetermined region of the polymer resin substrate.

More specifically, the forming of the conductive metal layer may be progressed by electroless plating, thereby forming a satisfactory conductive metal layer on the adhesion-activated surface.

For example, in the reducing or plating, the predetermined region of the resin product or the resin layer which generates metal cores may be treated with an acidic or basic solution containing a reducing agent, and this solution may contain one or more selected from the group consisting of formaldehyde, hypophosphite, dimethylamino borane (DMAB), diethylaminoborane (DEAB) and hydrazine as the reducing agent. Further, in the reducing or plating, the region may be treated with an electroless plating solution containing the reducing agent and conductive metal ions to form the conductive metal layer by electroless plating.

As the reducing or plating is carried out, the conductive metal ions included in the metal core are reduced, or the conductive metal ions in the electroless plating solution are chemically reduced in the region where the metal cores are formed as a seed, and therefore, an excellent conductive pattern may be selectively formed on the predetermined region. In this regard, the metal core and the adhesion-activated surface may form a strong bond with chemically reduced conductive metal ions, and as a result, the conductive pattern may be more easily formed selectively on the predetermined region.

Further, in the remaining region on which the conductive pattern is not formed, the non-conductive metal compound of Chemical Formula 1 having $P\bar{1}$, Cc or C2/c space group is uniformly dispersed in the resin structure.

Meanwhile, according to still another embodiment, provided is a resin structure having the conductive pattern which is obtained by using the composition for forming the conductive pattern and the method of forming the conductive pattern. The resin structure may include the polymer resin substrate; the non-conductive metal compound which is dispersed in the polymer resin substrate, has $P\bar{1}$ space group of a triclinic structure or Cc or C2/c space group of a monoclinic structure, and is represented by Chemical Formula 1; the adhesion-activated surface having the metal core which is exposed on the surface of a predetermined region of the polymer resin substrate; and the conductive metal layer formed on the adhesion-activated surface.

In the resin structure, the predetermined region where the adhesion-activated surface and the conductive metal layer are formed may correspond to the region of the polymer resin substrate to which the electromagnetic wave is irradiated. In addition, the metal or the ion thereof included in the metal cores of the adhesion-activated surface may be derived from the non-conductive metal compound of Chemical Formula 1 having $P\bar{1}$, Cc or C2/c space group. Meanwhile, the conductive metal layer may be derived from the metal included in the non-conductive metal compound of Chemical Formula 1 having $P\bar{1}$, Cc or C2/c space group or from the conductive metal ion included in the electroless plating solution.

Meanwhile, the resin structure may further include residues which are derived from the non-conductive metal compound. These residues may have a structure in which the metal is at least partially released from the non-conductive metal compound, and therefore, vacancy is formed in at least one portion of the compound.

The resin structure may have impact strength of 4.0 J/cm or more, as measured as Izod notched type according to ASTM D256, despite the addition of the above-described non-conductive metal compound. Thus, the resin structure may be used to provide a polymer resin product that maintains excellent mechanical properties while having a conductive pattern on a polymer resin substrate.

The above-described resin structure may be applied to a variety of resin products or resin layers having conductive patterns for antenna, such as a mobile phone or tablet PC case, or to a variety of resin products or resin layers having the conductive pattern, such as RFID tags, various sensors, MEMS structure, etc.

As described above, according to embodiments of the present invention, it is possible to easily manufacture a variety of resin products having different fine conductive patterns by a very simplified process of including laser electromagnetic irradiation and reduction or plating treatment.

Hereinafter, actions and effects of the present invention will be described in more detail with reference to specific Examples of the present invention. However, these Examples are provided only for illustrative purposes and are not intended to limit the scope of the present invention.

PREPARATION EXAMPLE 1

Synthesis of Non-Conductive Metal Compound $CuSn_2(PO_4)_3$

Copper carbonate hydrate ($CuCO_3 \cdot Cu(OH)_2$), tin chloride pentahydrate ($SnCl_4 \cdot 5H_2O$), and phosphoric acid ($H_3PO_4$) were weighed in a stoichiometric ratio, and dissolved in distilled water, and a solution was stirred at 60° C. for 2 hours to form a mixed solution of copper and tin. Subsequently, the mixed solution was centrifuged and dried in an oven (80° C.) to remove a solvent from the mixed solution. The solvent-removed solution was heat-treated at 900° C. for 2 hours.

Figure 4:
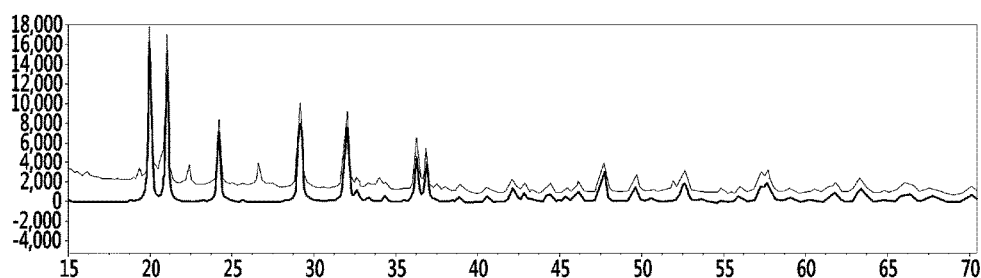
FIG. 4 shows XRD patterns of a non-conductive metal compound synthesized in Preparation Example 1.

XRD patterns showing crystal property of $CuSn_2(PO_4)_3$ synthesized under the above conditions are shown in FIG. 4.

The lower XRD pattern of FIG. 4 is an XRD pattern of pure $CuSn_2(PO_4)_3$ having $P\bar{1}$ space group, and the upper XRD pattern of FIG. 4 is an XRD pattern of the compound synthesized under the above conditions.

The results of XRD structural analysis by a Rietveld method show that $CuSn_2(PO_4)_3$ synthesized in Preparation Example 1 includes approximately 95% by weight of a non-conductive metal compound having $P\bar{1}$ space group of a triclinic structure and approximately 5% by weight of a non-conductive metal compound having $R\bar{3}c$ space group of a trigonal structure.

PREPARATION EXAMPLE 2

Synthesis of Non-Conductive Metal Compound $CuSn_2(PO_4)_3$

A non-conductive metal compound $CuSn_2(PO_4)_3$ was synthesized in the same manner as in Preparation Example 1, except that the calcination temperature was changed to 1100° C. in Preparation Example 1.

Figure 5:
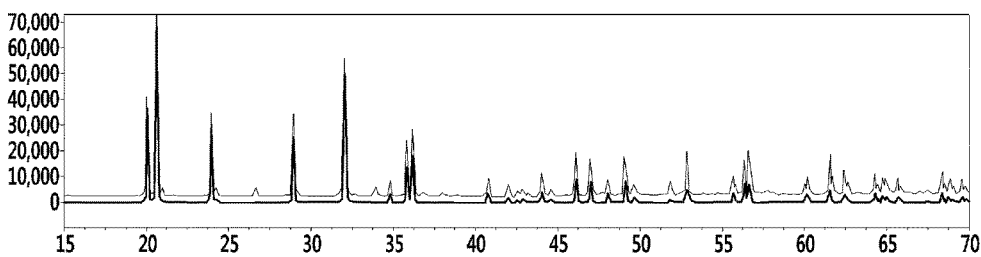
FIG. 5 shows XRD patterns of a non-conductive metal compound synthesized in Preparation Example 2.

XRD patterns of the compound synthesized under the above conditions are shown in FIG. 5. The lower XRD pattern of FIG. 5 is an XRD pattern of pure $CuSn_2(PO_4)_3$ having $R\bar{3}c$ space group, and the upper XRD pattern of FIG. 5 is an XRD pattern of the compound synthesized under the above conditions.

The results of XRD structural analysis by the Rietveld method show that $CuSn_2(PO_4)_3$ synthesized in Preparation Example 2 includes approximately 5% by weight of a non-conductive metal compound having $P\bar{1}$ space group of a triclinic structure and approximately 95% by weight of a non-conductive metal compound having $R\bar{3}c$ space group of a trigonal structure. Therefore, it was confirmed that the structure of the non-conductive metal compound is determined by heat treatment temperature.

EXAMPLE 1

Formation of Conductive Pattern by Direct Laser Irradiation

A polycarbonate resin as a basic resin and the non-conductive metal compound $CuSn_2(PO_4)_3$ prepared in Preparation Example 1 were used, and additives for processing and stabilization were also used to prepare a composition for forming a conductive pattern by electromagnetic irradiation.

A heat stabilizer (IR1076, PEP36), a UV stabilizer (UV329), a lubricant (EP184), and an impact modifier (S2001) were used as the additives.

The polycarbonate resin of 85% by weight were mixed with $CuSn_2(PO_4)_3$ prepared in Preparation Example 1 of 10% by weight, the impact modifier of 4% by weight, and other additives of 1% by weight so as to obtain a composition, and the composition was extruded in an extruder at 260° C. to 280° C. A pellet-type resin composition thus extruded was subjected to injection-molding at approximately 260° C. to approximately 270° C. to give a substrate having a diameter of 100 mm and a thickness of 2 mm and an izod bar according to ASTM standard.

The injection-molded sample was irradiated with laser under the conditions of 40 kHz to activate the surface. An electroless plating process was carried out as follows.

A plating solution (hereinbelow, referred to as PA solution) was prepared by dissolving 3 g of copper sulfate, 14 g of Rochelle salt, and 4 g sodium hydroxide in 100 ml of deionized water. 1.6 ml of formaldehyde as a reducing agent was added to 40 ml of the prepared PA solution. The resin structure, of which surface was activated by laser, was immersed in the plating solution for 4 to 5 hours, followed by washing with distilled water. By the above-described method, a resin structure having the conductive pattern of Example 1 was formed.

EXAMPLE 2

Formation of Conductive Pattern by Direct Laser Irradiation

A composition for forming a conductive pattern was prepared in the same manner as in Example 1 and a resin structure having the conductive pattern was manufactured therefrom, except that the polycarbonate resin of 80% by weight and $CuSn_2(PO_4)_3$ prepared in Preparation Example 1 of 10% by weight were used, and $TiO_2$ of 5% by weight was additionally used as a pigment in Example 1.

COMPARATIVE EXAMPLE 1

Formation of Conductive Pattern by Direct Laser Irradiation

A composition for forming a conductive pattern was prepared in the same manner as in Example 1 and a resin structure having the conductive pattern was manufactured therefrom, except that the polycarbonate resin of 90% by weight was used and $CuCr_2O_4$ of 5% by weight was used instead of $CuSn_2(PO_4)_3$ prepared in Preparation Example 1 of 10% by weight in Example 1.

COMPARATIVE EXAMPLE 2

Formation of Conductive Pattern by Direct Laser Irradiation

A composition for forming a conductive pattern was prepared in the same manner as in Example 1 and a resin structure having the conductive pattern was manufactured therefrom, except that the polycarbonate resin of 91% by weight was used and $Cu_2(OH)(PO_4)$ of 4% by weight was used instead of $CuSn_2(PO_4)_3$ prepared in Preparation Example 1 of 10% by weight in Example 1.

COMPARATIVE EXAMPLE 3

Formation of Conductive Pattern by Direct Laser Irradiation

A composition for forming a conductive pattern was prepared in the same manner as in Example 1 and a resin structure having the conductive pattern was manufactured therefrom, except that $Cu_2(OH)(PO_4)$ of 4% by weight was used instead of $CuSn_2(PO_4)_3$ prepared in Preparation Example 1 of 10% by weight and $TiO_2$ of 6% by weight was additionally used as a pigment in Example 1.

COMPARATIVE EXAMPLE 4

Formation of Conductive Pattern by Direct Laser Irradiation

A composition for forming a conductive pattern was prepared in the same manner as in Example 1 and a resin structure having the conductive pattern was manufactured therefrom, except that the polycarbonate resin of 90% by weight was used, and $Sb/SnO_2$ of 5% by weight was used instead of $CuSn_2(PO_4)_3$ prepared in Preparation Example 1 of 10% by weight.

EXPERIMENTAL EXAMPLE

Evaluation of Impact Strength and Adhesion Strength of Conductive Pattern (1) Evaluation of Impact Strength of Conductive Pattern
Impact strengths of the conductive patterns (or plating layers) formed on the resin structures of Examples 1 to 2 and Comparative Examples 1 to 4 were measured by Izod notched type according to ASTM D256.

(2) Evaluation of Adhesion Strength of Conductive Pattern

Adhesion strengths of conductive patterns (or plating layers) which were formed on the resin structures of Examples 1 to 2 and Comparative Examples 1 to 4 were evaluated according to the standard ISO 2409. In the adhesion strength evaluation according to the standard ISO 2409, Class 0 indicates that a delamination area of a conductive pattern is 0% of an area of a conductive pattern to be evaluated and Class 1 indicates that a delamination area of a conductive pattern is more than 0% to 5% or less of an area of a conductive pattern to be evaluated. Class 2 indicates that a delamination area of a conductive pattern is more than 5% to 15% or less of an area of a conductive pattern to be evaluated. Class 3 indicates that a delamination area of a conductive pattern is more than 15% to 35% or less of an area of a conductive pattern to be evaluated. Class 4 indicates that a delamination area of a conductive pattern is more than 35% to 65% or less of an area of a conductive pattern to be evaluated. Class 5 indicates that a delamination area of a conductive pattern is more than 65% of an area of a conductive pattern to be evaluated.

(3) Evaluation of Physical Property (MFR: Melt Flow Rate) of Resin Structures

MFRs of the resin structures of Examples 1 to 2 and Comparative Examples 1 to 4 were measured at a temperature of 300° C. and under a load of 1.2 kg according to ASTMD1238.

(4) Evaluation of Chromaticity of Resin Structures

According to the standard method of ASTM 2244, CIE Lab color coordinates were measured in the resin structures of Examples 1 to 2 and Comparative Examples 1 to 4 using a color coordinate of X-rite color eye 7000A, and as a result of the measurement, derived L values are shown in the following Table 1.

The evaluation results are as summarized in the following Table 1. These evaluation results were summarized by comparing with bare PC including no non-conductive metal compound and no conductive pattern.

Referring to Table 1, it was confirmed that when the non-conductive metal compound having the specific three-dimensional structure according to an embodiment was used as in Examples 1 and 2, a conductive pattern having excellent adhesion strength may be formed on the surface of a polymer resin without a great change in intrinsic physical properties of the polymer resin.

Further, as the content of the non-conductive metal compound was increased, impact strength of the resin structure tends to decrease. The resin structures manufactured in Examples 1 and 2 showed excellent impact strength, even though they included a large amount of the non-conductive metal compound. In particular, the resin structures of Examples 1 and 2 showed impact strength strong enough to be used in a resin product on which an embedded antenna was formed.

In contrast, when $CuCr_2O_4$ was used as the non-conductive metal compound as in Comparative Example 1, the resin structure did not show the own color of the polymer resin due to a dark color of $CuCr_2O_4$ and showed a very low L value.

Further, when $Cu_2(OH)(PO_4)$ was used as the non-conductive metal compound as in Comparative Examples 2 and 3, the intrinsic physical property of the polymer resin, such as thermal stability, etc., was reduced, and MFR of the resin structure was greatly increased due to $Cu_2(OH)(PO_4)$. Further, when $Sb/SnO_2$ was used as the non-conductive metal compound as in Comparative Example 4, the intrinsic physical property of the polymer resin was deteriorated, and thus impact strength of the resin structure was greatly reduced.

Accordingly, it was confirmed that when the non-conductive metal compound having the specific three-dimensional structure according to an embodiment of the present invention is used, a conductive pattern having high adhesion strength may be formed by a simplified process of laser electromagnetic irradiation, while maintaining the intrinsic physical property of the polymer resin at good levels.

The invention claimed is:

1. A composition for forming a conductive pattern by electromagnetic irradiation, comprising:

TABLE 1

| | Example 1 | Example 2 | Comparative Example 1 | Comparative Example 2 | Comparative Example 3 | Comparative Example 4 | Bare PC |
|---|---|---|---|---|---|---|---|
| Polycarbonate resin [% by weight] | 85 | 80 | 90 | 91 | 85 | 90 | 95 |
| Non-conductive metal compound [% by weight] | 10 | 10 | 5 | 4 | 4 | 5 | — |
| Pigment [% by weight] | 0 | 5 | 0 | 0 | 6 | 0 | 0 |
| Impact modifier [S2001, % by weight] | 4 | 4 | 4 | 4 | 4 | 4 | 4 |
| Other additives [% by weight] | 1 | 1 | 1 | 1 | 1 | 1 | 1 |
| Laser average power [W] | 12.9 | 11.4 | 10 | 10 | 10 | 10 | 10 |
| Izod notched, Impact strength (1/8") [J/cm] | 5.6 | 5.2 | 7.14 | 6.33 | 5.82 | 3.57 | 7.04 |
| Adhesion strength (ISO Class) | 0 | 0 | 1 | 1 | 1 | 2 | 5 |
| MFR [g/10 min] | 13 | 17 | 18 | 31 | 32 | 14 | 17 |
| Color scale L | 72.5 | 92.2 | 30.4 | 76.5 | 91.8 | 72.8 | 82.9 | a polymer resin; and a non-conductive metal compound which has P$\bar{1}$ space group of a triclinic structure or Cc or C2/c space group of a monoclinic structure and is represented by Chemical Formula 1, wherein a metal core can be formed from the non-conductive metal compound by electromagnetic irradiation:

$$A_xB_2P_3O_{12} \quad \text{[Chemical Formula 1]}$$

wherein A is one or more metals selected from the group consisting of Na, Cu, Ag and Au, and B is one or more metals selected from the group consisting of Sn, Ti, Zr and Hf, and x is a rational number of 0.5 to 1.

2. The composition for forming the conductive pattern by electromagnetic irradiation of claim 1, further comprising a non-conductive metal compound represented by Chemical Formula 1, which has R$\bar{3}$c space group of a trigonal structure:

$$A_xB_2P_3O_{12} \quad \text{[Chemical Formula 1]}$$

wherein A and B are each independently metals different from each other, and x is a rational number of 0.5 to 1.

3. The composition for forming the conductive pattern by electromagnetic irradiation of claim 1, wherein the polymer resin comprises a thermosetting resin.

4. The composition for forming the conductive pattern by electromagnetic irradiation of claim 1, wherein the polymer resin comprises one or more selected from the group consisting of an acrylonitrile poly-butadiene styrene (ABS) resin, a polyalkyleneterephthalate resin, a polycarbonate resin, a polypropylene resin, and a polyphthalamide resin.

5. The composition for forming the conductive pattern by electromagnetic irradiation of claim 1, wherein the non-conductive metal compound is comprised in an amount of 0.1% by weight to 15% by weight, based on the total composition.

6. The composition for forming the conductive pattern by electromagnetic irradiation of claim 1, further comprising one or more additives selected from the group consisting of a flame retardant, a heat stabilizer, a UV stabilizer, a lubricant, an antioxidant, an inorganic filler, a color additive, an impact modifier, and a functional modifier.

7. The composition for forming the conductive pattern by electromagnetic irradiation of claim 1, wherein the polymer resin comprises a thermoplastic resin.

8. A resin structure having a conductive pattern, comprising:

a polymer resin substrate;

a non-conductive metal compound which is dispersed in the polymer resin substrate, has P$\bar{1}$ space group of a triclinic structure or Cc or C2c space group of a monoclinic structure, and is represented by Chemical Formula 1:

$$A_xB_2P_3O_{12} \quad \text{[Chemical Formula1]}$$

wherein A and B are each independently metals different from each other, and x is a rational number of 0.5 to 1;

an adhesion-activated surface having a metal core which is exposed on the surface of a predetermined region of the polymer resin substrate; and a conductive metal layer formed on the adhesion-activated surface that forms the conductive pattern.

9. The resin structure having the conductive pattern of claim 8, wherein the predetermined region where the adhesion-activated surface and the conductive metal layer are formed corresponds to the region of the polymer resin substrate to which an electromagnetic wave is irradiated.

10. The resin structure having the conductive pattern of claim 8, wherein the resin structure has impact strength of 4.0 J/cm or more, as measured by Izod notched type according to ASTM D256.

* * * * *